US010199259B1

(12) United States Patent
Smith et al.

(10) Patent No.: US 10,199,259 B1
(45) Date of Patent: Feb. 5, 2019

(54) TECHNIQUE FOR DEFINING ACTIVE REGIONS OF SEMICONDUCTOR DEVICES WITH REDUCED LITHOGRAPHY EFFORT

(71) Applicant: GLOBALFOUNDRIES Inc., Grand Cayman (KY)

(72) Inventors: Elliot John Smith, Dresden (DE); Michael Zier, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/670,465

(22) Filed: Aug. 7, 2017

(51) Int. Cl.
*H01L 21/308* (2006.01)
*H01L 21/762* (2006.01)
*G03F 7/00* (2006.01)
*G03F 7/20* (2006.01)
*G03F 1/00* (2012.01)

(52) U.S. Cl.
CPC .......... *H01L 21/76229* (2013.01); *G03F 1/06* (2013.01); *G03F 7/0035* (2013.01); *G03F 7/70341* (2013.01); *H01L 21/308* (2013.01)

(58) Field of Classification Search
CPC ... H01L 21/76229; H01L 21/308; G03F 1/06; G03F 7/0035; G03F 7/70341
See application file for complete search history.

(56) References Cited

U.S. PATENT DOCUMENTS

2014/0024191 A1* 1/2014 Chen ................. H01L 21/26586
438/294
2016/0071758 A1* 3/2016 See ................... H01L 21/76229
257/347

* cited by examiner

*Primary Examiner* — Joseph Galvin, III
(74) *Attorney, Agent, or Firm* — Amerson Law Firm, PLLC

(57) ABSTRACT

In semiconductor devices requiring the formation of fully depleted SOI transistor elements in combination with non-FET elements, such as substrate diodes and the like, the patterning of the active regions may be accomplished on the basis of deep isolation trenches, which may be formed first on the basis of immersion-based lithography, followed by formation of shallow isolation trenches also formed on the basis of immersion lithography. Thereafter, respective openings connecting to the substrate materials may be formed, possibly in combination with isolation trenches of reduced depth compared to the deep isolation trenches, on the basis of non-immersion lithography techniques. In this manner, device scaling for semiconductor devices requiring critical dimensions of 26 nm and less in a planar transistor architecture may be accomplished.

14 Claims, 15 Drawing Sheets

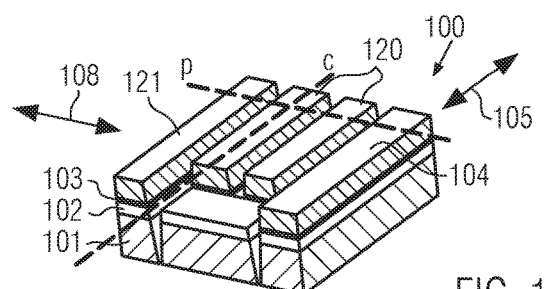
FIG. 1F
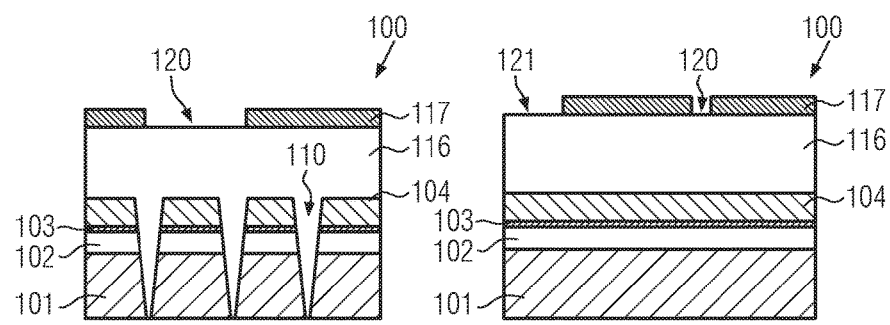
FIG. 1G
FIG. 1H
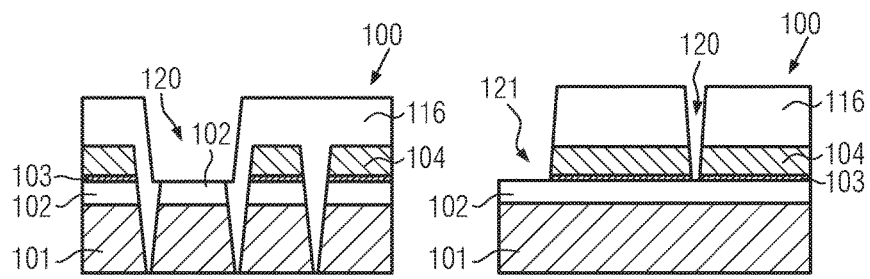
FIG. 1I
FIG. 1J

TECHNIQUE FOR DEFINING ACTIVE REGIONS OF SEMICONDUCTOR DEVICES WITH REDUCED LITHOGRAPHY EFFORT

BACKGROUND

1. Field of the Disclosure

The subject matter disclosed herein relates to semiconductor devices and techniques for forming active semiconductor regions for circuit elements and integrated circuits.

2. Description of the Related Art

The fabrication of integrated circuits requires tiny regions of precisely controlled size to be formed in one or more material layers of an appropriate substrate, such as a silicon substrate, a semiconductor (or silicon)-on-insulator (SOI) substrate, or other suitable carrier materials. These tiny regions of precisely controlled size are typically defined by patterning the material layer or layers by applying processes involving lithography, etch, implantation, deposition techniques and the like, wherein, at least in a certain stage of the patterning process, typically, a mask layer must be formed over the one or more material layers to be treated in order to define these tiny regions.

Generally, a mask layer may consist of or may be formed by means of a layer of resist material that is patterned by a lithography process, typically a photolithography process. During the photolithography process, the resist may be spin coated onto a substrate surface and may then be selectively exposed to ultraviolet radiation through a corresponding lithography mask, such as a reticle, thereby imaging the reticle pattern into the resist layer to form a latent image therein. After developing the photoresist, depending on the type of resist, i.e., a positive or negative resist, the exposed portions or the non-exposed portions are removed to form the required pattern in the layer of photoresist. Based on this resist pattern, other mask materials and finally the actual device patterns may be formed by further manufacturing processes, such as etching, implantation and the like. Since the dimensions of the patterns in semiconductor devices are steadily decreasing, the equipment used for patterning device features has to meet very stringent requirements regarding resolution and overlay accuracy of the involved fabrication processes. One important factor in improving the resolution is the lithography process, in which patterns contained in the photomask or reticle are optically transferred to the substrate via an optical imaging system. Therefore, great efforts are being made to steadily improve optical properties of the lithography system, such as numerical aperture, depth of focus and wavelength of the light source used.

The resolution of the optical patterning process may, therefore, significantly depend on the imaging capability of the equipment used, the photoresist materials for the specified exposure wavelength, and the target critical dimensions of the device features to be formed in the device level under consideration. For example, in present critical lithography steps, an exposure wavelength of 193 nm (ArF) may be used, wherein, in recent developments, in particular, numerical aperture and depth of focus have been significantly improved by implementing a so-called "immersion" technique, in which a liquid of appropriate index of refraction may be provided between the last lens of the complex optical system and the semiconductor substrate that receives the light pattern through a corresponding lithography mask.

On the basis of such highly complex optical systems, critical dimensions of circuit elements, such as gate electrodes and field effect transistors, may be formed with a length of less than 30 nm. Similarly, in any such semiconductor devices requiring a gate length of the above-specified range, the size and shape of respective active semiconductor regions, i.e., the semiconductor material in and on which respective transistor elements have to be formed, may also have to be defined, i.e., laterally delineated, on the basis of respective isolation structures which may have, at least partially, critical dimensions that are comparable with the minimum critical dimensions used in semiconductor devices. Consequently, the actual feature dimensions of semiconductor devices may be well below the wavelength of currently used light sources provided in lithography systems, thereby requiring highly non-linear processes and specific measures, such as the provision of an immersion liquid and the like, in order to obtain dimensions well below the optical resolution. For example, extremely non-linear photoresist materials may be used, in which a desired photochemical reaction may be initiated on the basis of a well-defined threshold so that weakly exposed barriers may not substantially change at all, while areas having exceeded the threshold may exhibit a significant variation of their chemical stability with respect to a subsequent development process.

Consequently, significant advances and developments of appropriate photoresist materials, in combination with the progress made in providing highly complex imaging tools, may enable the printing of mask features having critical dimensions that are significantly less compared to the exposure wavelength used.

Moreover, additional process techniques may be applied which enable a further reduction of the resist features, thereby even further reducing the critical dimensions of circuit elements. For example, appropriate hard mask features may be formed on the basis of trim etch and deposition techniques, thereby enabling the patterning of gate electrode structures, active regions and the like with critical dimensions that substantially correspond to the previously adjusted width of the mask features. In semiconductor devices, in particular, critical dimensions are not only required in one lateral direction, for instance along a transistor length direction, but also the orthogonal direction may require a patterning, for instance, a lateral separation of active semiconductor regions with dimensions that are comparable with the critical dimensions, in particular, when considering densely packed device areas, such as static RAM areas in complex semiconductor devices. For this reason, complex lithography sequences have been developed in which a definition of circuit features along two different lateral directions may be accomplished by applying two separate lithography processes, wherein, depending on the overall process strategy, an appropriate mask may be patterned on the basis of two lithography steps, while, in other cases, respective device features may be formed in a first lithography and etch sequence along a first lateral direction, while these device features may be patterned in the orthogonal lateral direction in a corresponding lithography and etch sequence, thereby requiring high accuracy techniques for reducing any unwanted overlay errors.

In recent developments, various approaches have been taken in order to design highly complex integrated circuits with critical dimensions of 30 nm and significantly less, wherein, on the one hand, three-dimensional transistor architectures may be implemented, thereby requiring highly complex manufacturing strategies. In another approach, transistor performance has been significantly improved on the basis of well-established planar transistor architectures by employing fully depleted semiconductor regions, above which highly complex, yet well-established, gate electrode structures may be formed. On the basis of the fully depleted configuration of the semiconductor region, which is basically accomplished by using a very thin semiconductor material, such as a crystalline silicon material, a crystalline silicon/germanium and the like, with an initial thickness of 15 nm and significantly less, a plurality of problems associated with the reduction of overall transistor dimensions may have been addressed. In further developments, the fully depleted transistor configuration may be established on the basis of an SOI architecture, in which a buried insulating layer is formed below the fully depleted crystalline semiconductor material, thereby providing for even further enhanced device characteristics due to the fully electrically isolated semiconductor region, in addition to further superior mechanisms for enhancing overall channel controllability, for instance, by using the semiconductor material positioned below the buried insulating layer as an additional control gate for adjusting the transistor characteristics.

In particular, these transistor architectures may require a plurality of process steps, such as properly contacting the crystalline semiconductor region in the substrate in order to implement the additional control mechanism, which, in turn, may require a specific lateral delineation of the corresponding "buried" doped semiconductor regions, also referred to as well regions, in addition to the lateral delineation of the actual active semiconductor region, i.e., the fully depleted crystalline semiconductor regions used for forming therein and thereabove the respective transistor elements. For example, providing a connection to the well regions may typically require the formation a so-called "hybrid" region, in which the buried insulating material may be locally removed adjacent to the actual active regions in order to obtain access to the respective well regions. Since, in any such transistor configurations, the drain and source regions may typically have to be provided in the form of an in situ doped epitaxially grown semiconductor material with raised configuration, respective contact regions for connecting to the well regions may also be implemented in the form of an in situ doped epitaxially grown semiconductor material, thereby requiring appropriate deposition conditions in and on the exposed portion of the crystalline substrate material.

Moreover, in any such hybrid regions, other circuit elements, such as substrate diodes, high voltage transistors in the form of LDMOS transistors, and the like, may have to be formed, thereby also typically requiring the epitaxial growth of a respective semiconductor material.

As discussed above, highly complex processes may be required in particular, with respect to the patterning of gate electrode structures and also the patterning of the active semiconductor regions for fully depleted devices formed on the basis of an SOI architecture, wherein, in particular, lithography steps based on immersion techniques may significantly contribute to the overall manufacturing costs. Although planar transistor elements based on critical gate dimensions of approximately 30 nm and less may be fabricated on the basis of well-established, yet complex, process schemes, it turns out that these approaches may result in significant costs for further device scaling and may even encounter significant difficulties, for instance, with respect to overlay errors when, for instance, shallow trench isolations may be provided together with "deep" trenches having to be subsequently formed in order to appropriately laterally delineate or border respective well regions, as discussed above. In other cases, the well-established process regimes may require additional process steps for providing access to individual P-type and N-type transistors in order to implement therein respective additional control mechanisms, such as a back bias mechanism and the like. As discussed above, any additional lithography process, in particular a lithography based on immersion techniques, may, therefore, greatly contribute to the overall manufacturing costs and may, therefore, render a straightforward continuation of well-established patterning regimes for forming planar fully depleted SOI transistors less than desirable.

Therefore, in view of the situation described above, the present disclosure relates to semiconductor devices and manufacturing techniques in which patterning regimes may be applied for laterally defining, i.e., delineating or bordering, active regions of transistor elements, while avoiding or at least reducing the effects of one or more of the problems identified above.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure is generally based on the finding that the complexity of the overall manufacturing flow for forming SOI-based transistor elements in an early manufacturing stage may result in significant difficulties regarding overlay accuracy and/or connection to well regions positioned below the buried insulating material of a SOI transistor element and/or forming appropriate crystalline semiconductor contact regions for connecting to the substrate materials and/or forming non-field effect transistor elements, such as substrate diodes and the like. Based on this finding, it has been recognized that, in particular, the patterning sequence for defining, i.e., laterally delineating or bordering, the crystalline active semiconductor regions and corresponding well regions may be accomplished on the basis of an overall process flow that may address at least some of the problems, while also providing reduced overall complexity and, thus, reduced manufacturing costs of such semiconductor devices, for instance, requiring critical dimensions of 20 nm and below. To this end, it has been recognized that the patterning of deep trenches, i.e., of isolation trenches extending into the substrate material so as to laterally delineate respective well regions therein, may be performed prior to the patterning of any further isolation trenches or structures which may be required for laterally delineating active semiconductor regions, in particular, cutting through adjacent semiconductor regions in highly dense device areas, such as static RAM areas, in which a respective lateral distance of 30 nm and significantly less may be required in view of enhancing overall device density. Consequently, upon implementing such a manufacturing regime, the application of immersion-based lithography sequences may be maintained at a low number, while at the same time providing superior overlay accuracy and, in particular, providing the basis for forming respective openings in the buried insulating layer for appropriately connecting to the substrate material.

In some illustrative aspects disclosed herein, a two-level isolation structure may suffice for appropriately laterally delineating or bordering the respective active semiconductor regions and for providing connectivity to the substrate material and, therefore, also accommodating the possibility of implementing non-field effect transistor elements, such as substrate diodes and the like. In other illustrative aspects disclosed herein, a three-level isolation structure may be accomplished, however, without requiring an increased number of immersion-based lithography sequences, wherein, in particular, the three-level isolation structure may provide superior process robustness in view of forming epitaxially grown semiconductor materials on exposed portions of the substrate material.

One illustrative embodiment disclosed herein relates to a method of forming a first type of isolation trench so as to delineate active regions for transistor elements in a semiconductor layer along a first lateral direction, wherein the first type of isolation trench extends through the semiconductor layer, a buried insulating layer and into a substrate material. The method further includes, after forming the first type of isolation trench, forming a second type of isolation trench so as to delineate the active regions along a second lateral direction differing from the first lateral direction, wherein the second type of isolation trench extends to the buried insulating layer. After formation of the second type of isolation trench, the method additionally includes forming an opening so as to expose a portion of the substrate material at a position that is laterally offset from the active region delineated by the first and second types of isolation trenches.

A further illustrative embodiment disclosed herein relates to a semiconductor device. The semiconductor device includes an active semiconductor region formed on a buried insulating layer and delineated along a first lateral direction and along a second lateral direction by a first type of isolation structure, a second type of isolation structure and a third type of isolation structure. The first type of isolation structure extends into a substrate material to a first depth, the second type of isolation structure extends to the buried insulating layer, and the third type of isolation structure extends into the substrate material to a second depth that is less than the first depth.

A still further illustrative embodiment disclosed herein relates to a semiconductor device. The semiconductor device includes an active semiconductor region formed on a buried insulating layer and delineated along a first lateral direction and a second lateral direction by a first type of isolation structure and a second type of isolation structure. The first type of isolation structure extends into a substrate material to a first depth and the second type of isolation structure extends to the buried insulating layer. Moreover, the semiconductor device includes an opening formed in the buried insulating layer so as to extend to a surface of the substrate material. Additionally, the semiconductor device includes a semiconductor region that is epitaxially formed on a portion of a surface in the opening.

BRIEF DESCRIPTION OF THE DRAWINGS

The disclosure may be understood by reference to the following description taken in conjunction with the accompanying drawings, in which like reference numerals identify like elements, and in which:

FIG. 1F schematically illustrates a perspective view of the semiconductor device of FIG. 1A in a further advanced manufacturing stage with a second type of isolation trench for laterally delineating the active semiconductor regions in a second lateral direction;

FIGS. 1G-1L schematically illustrate cross-sectional views along a line p of FIG. 1F (FIG. 1G, FIG. 1I, FIG. 1K) and along a line c of FIG. 1F (FIG. 1H, FIG. 1J, FIG. 1L), respectively;

Figure 1A:
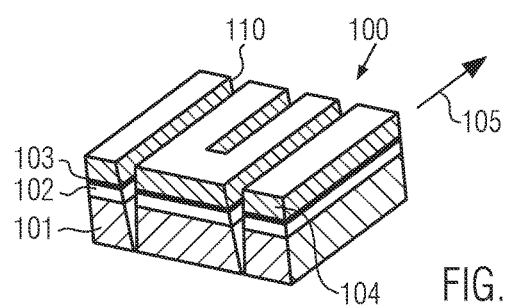
FIG. 1A schematically illustrates a perspective view of a semiconductor device in an early manufacturing stage with one type of isolation trench for laterally delineating active semiconductor regions at least in one lateral direction, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure generally provides manufacturing techniques and respective semiconductor devices in which transistor elements on the basis of a buried insulating material and a very thin active semiconductor layer may be formed by appropriately defining, i.e., laterally delineating or bordering, the respective active semiconductor regions on the basis of a patterning strategy in which a number of highly immersion-based lithography processes may be maintained at a low number. For instance, in some illustrative embodiments, two immersion lithography steps may suffice for patterning the respective active semiconductor regions, in that respective deep trenches may be formed first in order to delineate or border respective active semiconductor regions at least in a first lateral direction. Thereafter, a second type of isolation trench that merely separates the previously-formed strips of active semiconductor material in a further lateral direction may be patterned with required critical dimensions on the order of magnitude of 30 nm and significantly less, while, at the same time, respective portions of the active semiconductor material may be removed at regions in which connection to the substrate material has to be provided.

In the technique disclosed herein, the first and second type of isolation trench may be patterned on the basis of immersion lithography, while any subsequent further patterning of the active semiconductor regions may be accomplished on the basis of a less critical lithography process, which may not require immersion lithography techniques, thereby contributing to superior cost efficiency. Furthermore, the concept described herein may also result in superior overall overlay accuracy and may provide the potential for appropriately implementing contact regions to the substrate material or device areas for forming therein non-FET devices, such as substrate diodes, high voltage transistor elements and the like. In addition to providing superior scalability of the patterning strategy for forming the active semiconductor regions and corresponding openings for connecting and exposing the substrate material, in some illustrative embodiments, superior process robustness may be achieved with respect to the formation of epitaxially grown semiconductor material in the substrate, since respective isolated semiconductor regions in the substrate material may be provided on the basis of a three-level isolation structure.

With reference to FIGS. 1A-1W, 2A-2N and 3J-3L, further illustrative embodiments will now be described in more detail, wherein reference may also be made to conventional process strategies as illustrated in FIGS. 3A-3I.

FIG. 1A schematically illustrates a perspective view of a semiconductor device 100 in an early manufacturing stage, in which a semiconductor layer 103 may have to be divided into a plurality of active semiconductor regions. In this context, an active semiconductor region or active region is to be understood as an area of crystalline semiconductor material in and above which transistor elements are to be formed. As previously discussed, in some applications, a fully depleted transistor configuration may be applied, in which a basic crystalline semiconductor material may be appropriately provided or prepared with respect to dopant concentration, material composition and the like so as to comply with a fully depleted configuration. To this end, in some illustrative embodiments, the semiconductor layer 103 may be initially provided in the form of any appropriate crystalline semiconductor material, such as silicon, silicon/germanium and the like, and may be prepared in accordance with well-established concepts with respect to dopant concentration, material composition and the like. For instance, in some device areas, a crystalline silicon/germanium mixture may be formed in or on the basis of the initial semiconductor layer 103. The semiconductor layer 103 may have an initial thickness of 15 nm and significantly less, wherein a corresponding thickness may still be adapted during the further processing in accordance with overall device requirements.

Furthermore, as discussed above, in some applications, an SOI architecture may be applied, wherein a buried insulating layer 102 may be positioned below the semiconductor layer 103 and may, therefore, separate the semiconductor layer 103 from a crystalline substrate material 101, such as a silicon material and the like. The buried insulating layer 102 may be formed of any appropriate dielectric material or materials, such as silicon dioxide, silicon oxynitride, silicon nitride, high-k dielectric materials and the like, depending on overall device requirements. A thickness of the buried insulating layer 102 may range from approximately 20-50 nm and even higher, depending on the overall device configuration.

Furthermore, a hard mask material used for protecting the sensitive semiconductor layer 103 and for patterning the semiconductor device 100 may be provided with appropriate material composition and thickness. For instance, the hard mask layer 104 may comprise silicon nitride and the like. A thickness thereof may range from approximately 20 nm to several tens of nm.

Furthermore, in the manufacturing stage shown, a first type of isolation trench 110, also referred to as deep trenches, may be provided so as to divide the hard mask layer 104, the semiconductor layer 103, the buried insulating layer 102 and an upper portion of the substrate material 101 into respective regions, thereby obtaining a lateral delineation or definition or bordering of these various device layers along a first lateral direction 105. The first type of isolation trench 110 may extend into the substrate material 101 with a depth of approximately 150-250 nm, while it should be appreciated, however, that the actual depth may depend on specific design criteria and, in particular, on lateral dimensions, i.e., a width of the trenches 110. Since the first type of isolation trench 110 may extend through the semiconductor layer 103, a respective lateral delineation along the first direction 105 may be obtained and may, therefore, define boundaries of respective "islands" or active semiconductor regions therein. It should be appreciated that a width of the deep trenches 110 may range from approximately 30 nm to significantly higher values, depending on the overall device requirements.

With reference to FIGS. 1B-1E, respective processes may be described so as to form the semiconductor device 100 as illustrated in FIG. 1A.

Figure 1B:
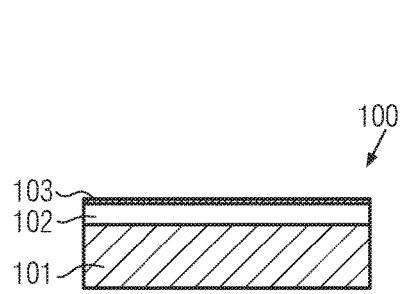
FIGS. 1B-1E schematically illustrate cross-sectional views of the semiconductor device of FIG. 1A during various manufacturing stages.

FIG. 1B schematically illustrates the semiconductor device in an initial state in which the semiconductor layer 103 may be formed on the buried insulating layer 102 without any lateral patterning. In this manufacturing stage, the semiconductor device 100 may be provided in the form of an appropriate SOI substrate, wherein the semiconductor layer 103 may be provided with an appropriate initial thickness and material composition, as discussed above. That is, in this state, Si/Ge areas, silicon and the like may be present.

Thereafter, a process sequence may be applied so as to form the hard mask layer 104 (see FIG. 1A) and other sacrificial material layers required for performing a lithography and patterning sequence. To this end, well-established materials and process techniques are available.

Figure 1C:
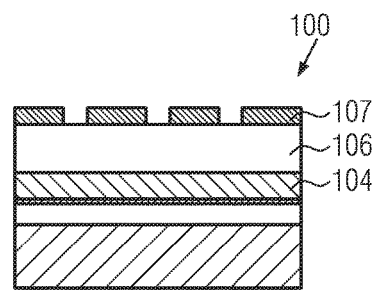

FIG. 1C schematically illustrates a cross-sectional view of the semiconductor device 100 after completing the above-described process sequence. That is, the semiconductor device 100 may comprise the hard mask layer 104, followed by an appropriate sacrificial layer 106, such as a polymer material, followed by a patterned mask layer 107. The hard mask material 104 may be formed by well-established deposition techniques, followed by depositing the sacrificial layer 106, for instance, by spin-on techniques and the like. Next, the mask layer 107, for instance in the form of silicon oxynitride and the like, may be deposited by well-established techniques, followed by the deposition of a resist material (not shown) which may be exposed by immersion lithography techniques. Thereafter, the mask layer 107 may be patterned and may be used as an etch mask during the further processing for forming the deep trenches.

Figure 1D:
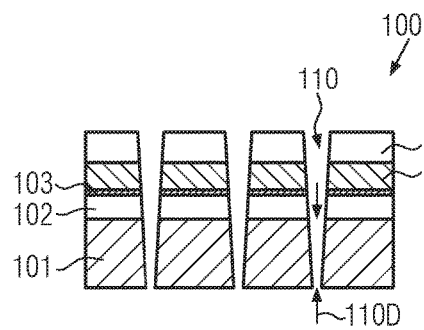

FIG. 1D schematically illustrates the semiconductor device 100 after completing the above-described process sequence. As illustrated, the trenches 110 may extend through the remaining portion of the sacrificial layer 106, the hard mask material 104, the semiconductor layer 103, the buried insulating layer 102 and into the substrate material 101, with a specific minimum first depth 110D, which may be defined as the vertical distance between the surface of the substrate material 101 and a bottom of the deep trenches 110. It should be appreciated that the depth 110D may slightly vary depending on the width of the deep trenches 110, wherein, however, a minimum depth of the deep trenches 110 may still be significantly deeper compared to a depth of any shallow trenches still to be formed.

Figure 1E:
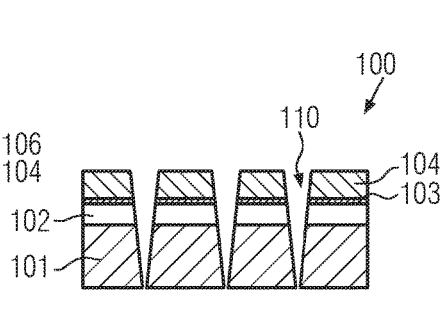

FIG. 1E schematically illustrates the semiconductor device 100 after removal of the sacrificial layer 106 (see FIG. 1D), which may be accomplished on the basis of any well-established removal processes, such plasma-assisted resist removal processes, wet chemical etch recipes and the like. Consequently, the deep trenches 110 are provided so as to extend through the hard mask material 104, the semiconductor layer 103 and the buried insulating layer 102, as discussed above.

On the basis of the device state as shown in FIG. 1E, the further processing may be continued by patterning the semiconductor layer 103 so as to be delineated in a further lateral direction, which may correspond to the horizontal direction of FIG. 1E.

FIG. 1F schematically illustrates a perspective view of the semiconductor device 100 in a further advanced manufacturing stage, in which a second type of isolation trench 120, 121 may be formed so as to provide a lateral delineation or bordering along a second lateral direction 108 that is perpendicular to the first lateral direction 105. As shown, the second type of isolation trench 120 may extend along the second lateral direction 108 and may, therefore, separate respective adjacent semiconductor strips along the first lateral direction 105 with a desired reduced distance, which, in some illustrative embodiments, may be 30 nm and less, for instance, approximately 25 nm to 20 nm and even less, in some applications. On the other hand, at least some of the isolation trenches of the second type, such as the trench 121, may be performed with increased lateral dimensions in order to appropriately laterally define isolation regions and, additionally, a region in which the substrate material 101 may have to be exposed in order to provide for connectivity to the substrate material for non-FET semiconductor devices, such as substrate diodes and the like.

It should be appreciated that the second type of isolation trench 120, 121 may extend through the hard mask material 104 and the semiconductor layer 103 and may, thus, terminate on or in the buried insulating layer 102.

With reference to FIGS. 1G-1L, the semiconductor device 100 may be described in various manufacturing stages for forming the device 100 as shown in FIG. 1F.

FIG. 1G schematically illustrates a cross-sectional view along the line p of FIG. 1F in a manufacturing stage in which a sacrificial material, such as a polymer material 116, may be formed in the trenches 110 and above horizontal surface areas in order to provide a planar surface topography. Furthermore, a mask layer 117 may be provided in a patterned form so as to expose respective areas corresponding to the second type of isolation trench 120, 121 (see FIG. 1F).

FIG. 1H schematically illustrates a cross-sectional view taken along the line c of FIG. 1F, wherein the mask layer 117 has openings therein which correspond to the second type of isolation trench 120, 121. That is, the lateral dimensions of the trenches 120, 121 may correspond to the respective lateral dimensions along the first direction 105 (see FIG. 1F), wherein a corresponding minimum "width," for instance, of the trench 120 to be formed in the lower-lying material layers may correspond to a range of 30 nm and significantly less, as discussed above.

The mask layer 117 may be formed on the basis of complex immersion-based lithography techniques, as also described above in the context of the mask layer 107 (see FIG. 1C), thereby providing the potential of obtaining the required minimum vertical dimensions, while overlay accuracy may be less critical. FIG. 1I schematically illustrates the semiconductor device 100 in a cross-sectional view corresponding to the cut line p of FIG. 1F in a further advanced manufacturing stage. As shown, the trench 120 may have been formed so as to extend to the buried insulating layer 102, thereby reliably removing any material of the semiconductor layer 103.

Similarly, FIG. 1J illustrates the semiconductor device 100 with the trench 120 corresponding to the line c of FIG. 1F, in which the respective trench 120 and the trench 121 are formed by removing the corresponding exposed portion of the semiconductor layer 103.

Generally, the semiconductor material of the layer 103 may be removed on the basis of well-established selective etch techniques, wherein the buried insulating layer 102 may be used as an efficient etch stop material. For instance, a plurality of highly selective etch recipes for crystalline silicon, crystalline silicon/germanium and the like, with respect to silicon dioxide or many other dielectric materials, are well established.

Figures 1K, 1L:
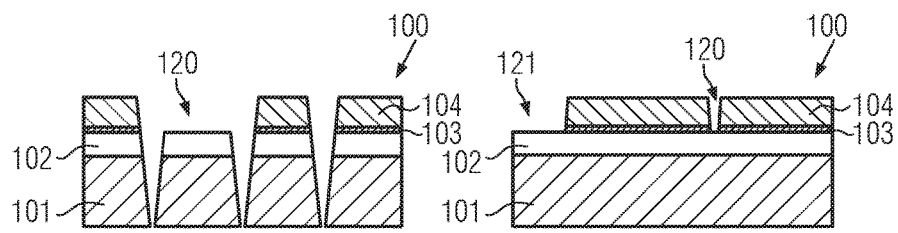

FIGS. 1K and 1L schematically illustrate the semiconductor device 100 corresponding to a section along line p and line c of FIG. 1F, respectively, after the removal of the sacrificial material layer 116 (see FIGS. 1I and 1J).

Consequently, upon forming the first and second types of isolation trench 110 and 120, 121 on the basis of immersion lithography techniques, the semiconductor layer 103 may be laterally delineated in the two lateral directions 105, 108, thereby allowing reduced critical dimensions, in particular, of the trenches 120, which may be highly advantageous in dense circuit regions, such as static RAM (random access memory) regions. Furthermore, by forming the deep trenches 110 first, the problem of overlay error of the trenches 120, 121 is less critical.

Figure 1M:
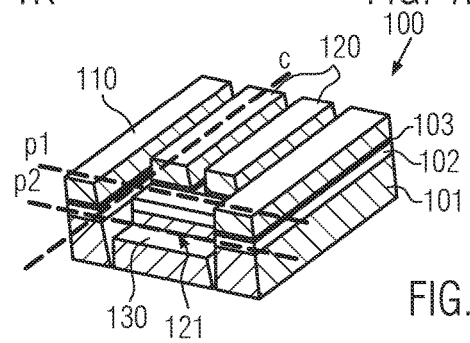
FIG. 1M schematically illustrates a perspective view of the semiconductor device in a further advanced manufacturing stage in which an opening may be provided so as to extend into the substrate material, thereby providing a third type of isolation trench.

FIG. 1M schematically illustrates a perspective view of the semiconductor device 100 in a further advanced manufacturing stage. As illustrated, in addition to the first type of isolation trench 110, i.e., the deep trenches, and the second type of isolation trench 120, 121, an opening 130 may be provided so as to expose a portion of the substrate material 101. In the embodiment shown in FIG. 1M, the opening 130 may represent a third type of isolation trench, which may extend into the substrate material 101, however, to a lesser depth compared to the depth or minimum depth of the deep trenches 110. That is, the third type of isolation trench 130 may, thus, provide a certain lateral delineation of portions of the substrate material 101, which may provide superior process conditions, for instance, when growing doped semiconductor material on a respective portion of the substrate material 101 that is delineated by the third type of isolation trench 130.

Processes for forming the semiconductor device 100 as shown in FIG. 1M may be explained with reference to the cross-sectional views of FIGS. 1N-1V.

Figures 1N, 1O:
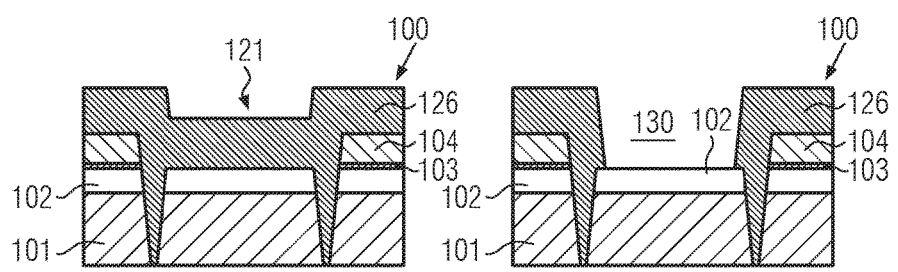
FIGS. 1N-1V schematically illustrate cross-sectional views of the semiconductor device of FIG. 1M along a line p1 (FIG. 1N, FIG. 1Q, FIG. 1T), along a line p2 (FIG. 1O, FIG. 1R, FIG. 1U) and along a line c (FIG. 1P, FIG. 1S, FIG. 1V) during various manufacturing stages.
Figure 1P:
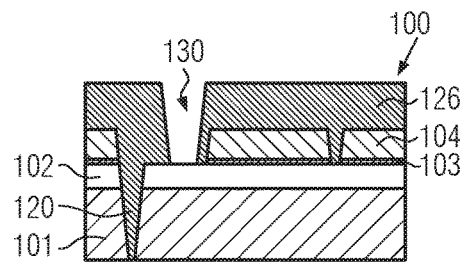

FIGS. 1N, 1O and 1P illustrate cross-sectional views along a line p1, a line p2 and a line c of FIG. 1M, respectively, in a manufacturing stage in which a lithography mask 126 may be provided and may be patterned so as to expose the opening or the third type of isolation trench 130. For instance, as illustrated in the cross-sectional view of FIG. 1N, the lithography mask 126 may be formed so as to cover the buried insulating layer 102 within the second type of isolation trench 121, while exposing the area of the opening or third type of isolation trench 130, as illustrated in FIG. 1O depicting the cross-sectional view along the line p2. FIG. 1P schematically illustrates the cross-sectional view along the line c, thereby illustrating the lithography mask 126 for exposing the opening 130, while covering the second type of isolation trench 120. The lithography mask 126 may be formed on the basis of well-established techniques, wherein it should be appreciated that two or more material layers may have to be provided, as is typically required in lithography processes, as previously discussed. It should be appreciated, however, that the patterning of the resist mask 126 may be accomplished on the basis of a non-immersion process, thereby reducing overall process complexity and, thus, manufacturing costs. Thereafter, an etch sequence may be applied so as to etch through the buried insulating layer 102 in the opening 130, followed by a further etch step for removing a portion of the substrate material 101.

Figures 1Q, 1R:
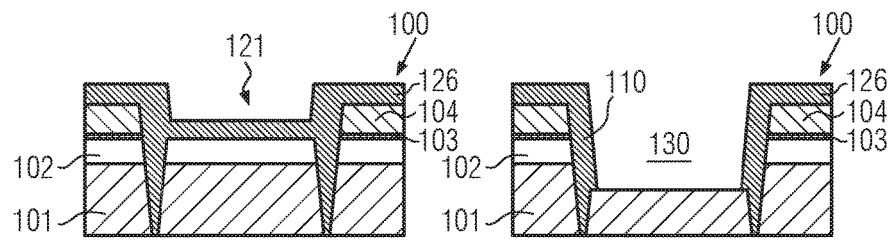
Figure 1S:
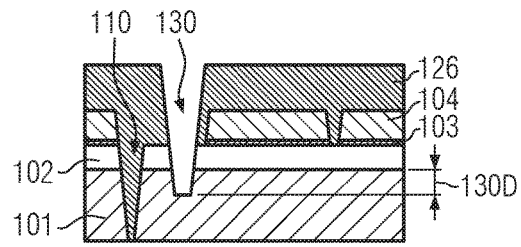

FIGS. 1Q, 1R and 1S schematically illustrate cross-sectional views along the lines p1, p2 and c, respectively, of the semiconductor device 100 after completing the above-described process sequence. That is, in the area of the opening 130 (see FIG. 1R), the material of the buried insulating layer 102 may be removed and a recess or trench, also referred to as 130, may be formed in the substrate material 101, as shown in FIG. 1R, representing the cross-sectional view along the line p2 of FIG. 1M. Similarly, as is evident from FIG. 1S, the opening or the third type of isolation trench 130 may be formed so as to extend into the substrate material 101 to a depth indicated as 130D, which is less compared to even a minimum extension in the depth direction 110D (see FIG. 1D) of the deep trenches 110.

Figures 1T, 1U:
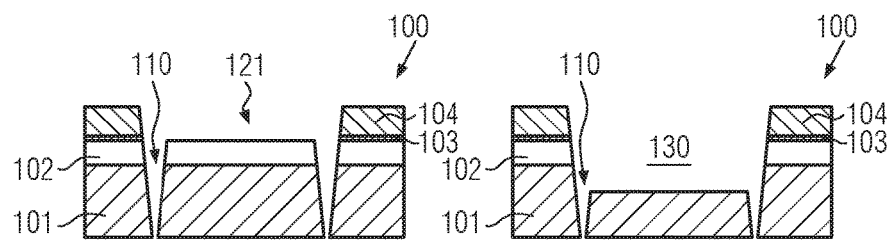

FIGS. 1T, 1U and iv schematically illustrate cross-sectional views along the lines p1, p2 and c, respectively, in a further advanced manufacturing stage. As illustrated, the lithography mask 126 is removed, which may be accomplished on the basis of any well-established plasma-assisted or wet chemical recipes, followed by respective cleaning processes. Consequently, as shown in FIG. 1T, the first type of isolation trench 110 in combination with one of the second type of isolation trenches, i.e., the trench 121, is formed, wherein the isolation trench 110 extends deeply into the substrate material 101, while the second type of isolation trench 121 extends to the buried insulating layer 102.

Similarly, FIG. 1U schematically illustrates a cross-sectional view of the semiconductor device 100 along the line p2, thereby illustrating the opening of a third type of isolation trench 130, which is laterally enclosed by the deep trenches 110.

Figure 1V:
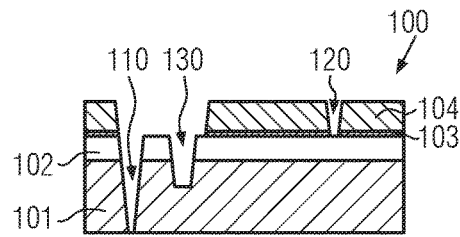

Finally, FIG. 1V, i.e., the cross-sectional view along the line c, illustrates the three types of isolation trenches 110, 120 and 130, wherein, as discussed above, a depth of the third type of isolation trench 130 is less compared to a minimum depth of the deep isolation trenches 110, while the second type of isolation trench 120 extends to the buried insulating layer 102.

On the basis of the device configuration as shown in FIGS. 1T, 1U and 1V, the further processing may be continued by filling the respective isolation trenches with one or more appropriate dielectric fill materials, such as silicon dioxide, silicon nitride and the like, and planarizing the resulting surface topography, which may be accomplished on the basis of well-established process techniques.

Figure 1W:
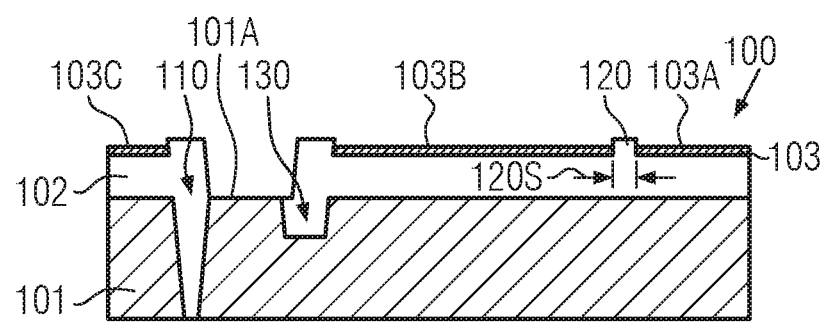
FIG. 1W schematically illustrates a cross-sectional view of a semiconductor device with appropriately filled isolation trenches, thereby forming respective isolation structures.

FIG. 1W schematically illustrates the semiconductor device 100 with appropriately filled isolation trenches 110, 120, 130, thereby forming respective isolation structures, which, for convenience, may also be referred to by the same reference numerals 110, 120, 130. Consequently, the initial semiconductor layer 103 may be divided into respective active regions 103A, 103B, 103C, which may be at least delineated along the lateral direction 105 (see FIG. 1A) by the deep trenches 110 (also see FIG. 1A), and may be delineated in the orthogonal direction 108 (see FIG. 1F) by some of the trenches 120, thereby providing a spacing 120S between the active regions 103A, 103B with 30 nm and significantly less in some applications, as already discussed above.

Furthermore, the isolation structure 130 with reduced depth compared to the isolation structure 110 may provide a laterally enclosed portion 101A of the substrate material 101. The portion 101A may be formed after filling the respective isolation trenches by performing an etch process for locally removing the buried insulating layer 102. In respective portions 101A, thus, the surface of the material layer 101 may be exposed for forming thereon and therein classical bulk FET devices, diodes, resistors, LDMOS, fuses and the like.

In some cases, when reduced surface topography may be considered advantageous, a further semiconductor material may be grown on the exposed portion 101A by selective epitaxial growth techniques. Irrespective of whether the exposed portion 101A is provided with additional semiconductor material or is used as obtained after removing the relevant portion of the buried insulating layer 102, contact with the substrate material 101 may be established by means of well-established and robust process techniques, wherein position, size and shape of the portion 101A may be substantially determined on the basis of the isolation trench 121 (see FIG. 1F). For instance, as shown in FIG. 1F, respective active regions laterally adjacent to the isolation trench 121 may still remain connected to the underlying substrate material 101 and may allow formation of the respective contact regions on the basis of the isolation trenches 130 with superior process robustness. Similarly, in other devices areas, respective isolation trenches 121 and corresponding openings 130 may be formed so as to enable the formation of non-FET devices, such as substrate diodes and the like, wherein the lateral enclosure of respective substrate portions 101A may also provide superior process robustness upon forming a conductive semiconductor material thereon.

Figure 2A:
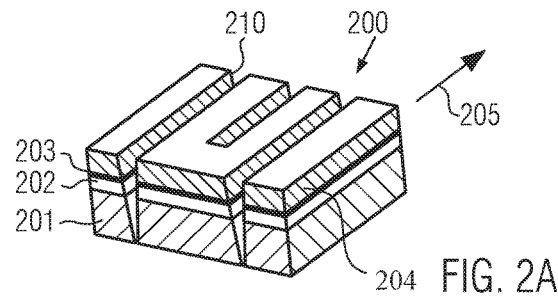
FIG. 2A schematically illustrates a perspective view of a semiconductor device including a first type of isolation trench in the form of deep isolation trenches for laterally delineating active semiconductor regions, according to a further illustrative embodiment.
Figure 2B:
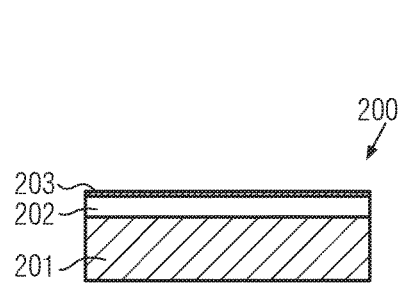
FIGS. 2B-2E schematically illustrate cross-sectional views of the semiconductor device of FIG. 2A during various manufacturing stages.
Figure 2C:
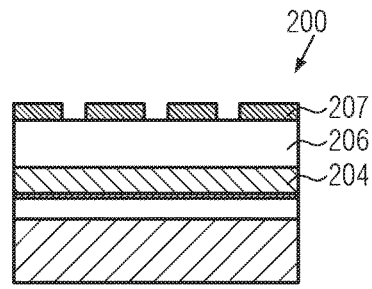
Figure 2D:
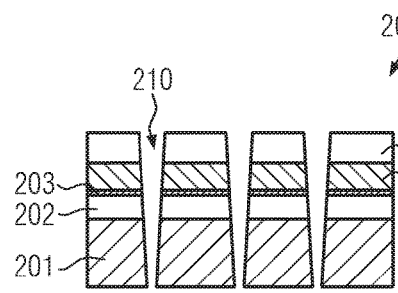
Figure 2E:
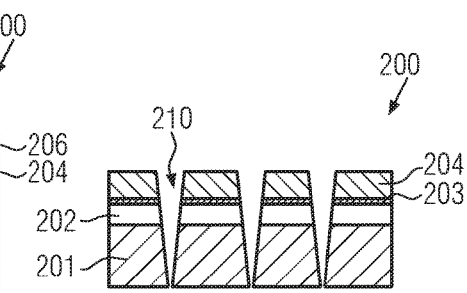
Figure 2F:
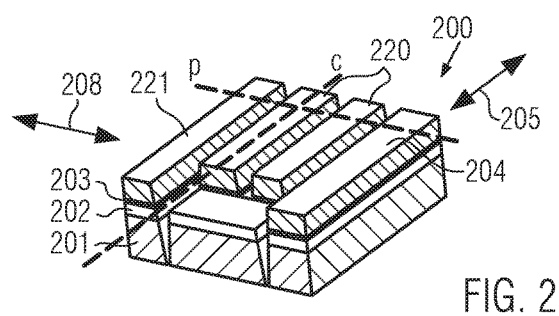
FIG. 2F schematically illustrates a perspective view of the semiconductor device of FIG. 2A in a further advanced manufacturing stage with a second type of isolation trench.
Figures 2G, 2H:
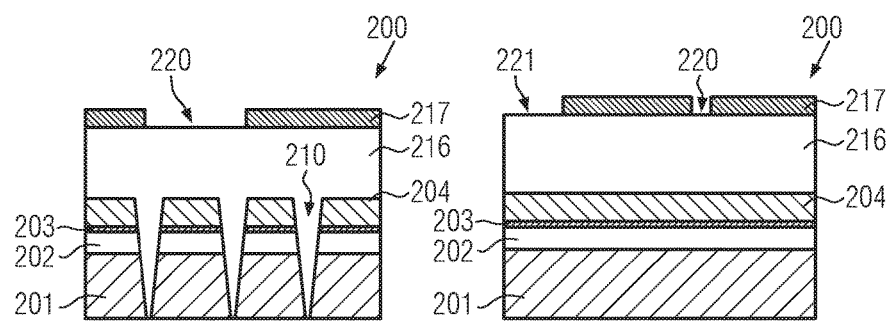
FIGS. 2G-2L schematically illustrate cross-sectional views of the semiconductor device of FIG. 2F along a line p (FIG. 2G, FIG. 2I, FIG. 2K) and along a line c (FIG. 2H, FIG. 2J, FIG. 2L) during various manufacturing stages.
Figures 2I, 2J:
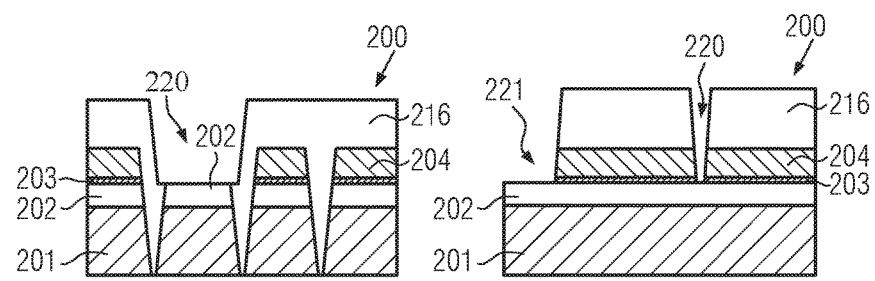
Figures 2K, 2L:
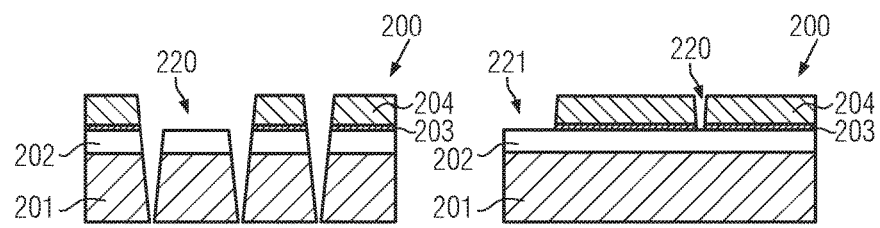
Figure 2M:
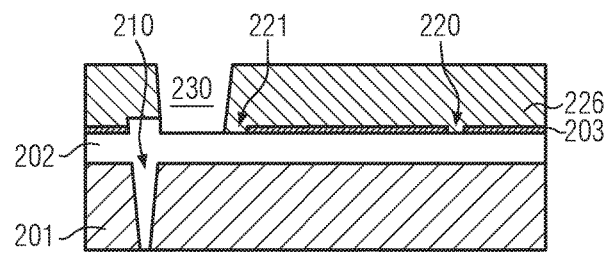
FIGS. 2M and 2N schematically illustrate cross-sectional views of the semiconductor device of FIGS. 2A and 2F during further advanced manufacturing stages.
Figure 2N:
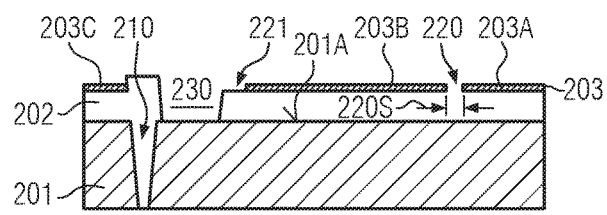

With reference to FIGS. 2A-2N, further illustrative embodiments will now be described, wherein lateral delineation or bordering of active semiconductor regions may be accomplished on the basis of a two-level isolation trench system.

FIG. 2A schematically illustrates a perspective view of a semiconductor device 200 in an early manufacturing stage in which a first type of isolation trench 210 may be formed so as to extend through a hard mask material 204, a semiconductor layer 203, a buried insulating layer 202 and into a substrate material 201. With respect to the components thus far described, the same criteria may apply as previously discussed with reference to FIG. 1A and the semiconductor device 100.

Processes for forming the semiconductor device 200 as shown in FIG. 2A may be described with reference to FIGS. 2B-2E, which are basically very similar to the process steps as previously discussed with reference to FIGS. 1B-1E for the semiconductor device 100.

FIG. 2B schematically illustrates a cross-sectional view of the semiconductor device 200 in an initial state, i.e., with the semiconductor layer 203 formed on the buried insulating layer 202, which is provided above the substrate material 201. Thereafter, appropriate material layers and an etch mask may be formed in accordance with complex immersion-based lithography techniques, as also discussed above.

FIG. 2C schematically illustrates the semiconductor device 200 in cross-sectional view after completing the above-described process sequence. That is, an etch mask 207, such as a silicon oxynitride material, in combination with an appropriate polymer material or bottom anti-reflective layer 206 may be formed on the hard mask 204. The patterning of the mask 207 may be accomplished by providing appropriate resist materials and exposing the same, as already discussed above.

FIG. 2D schematically illustrates the semiconductor device 200 after completing a respective etch sequence for etching through the layers 204, 203, 202 and into the substrate material 201 on the basis of the mask 207 and the layer 206. As already discussed above in the context of the semiconductor device 100, well-established etch recipes may be applied.

FIG. 2E schematically illustrates the semiconductor device 200 after the removal of the sacrificial material 206, which may be accomplished by well-established resist removal processes and the like. Consequently, the deep trenches 210 may have been formed so as to laterally delineate portions of the semiconductor layer 203 along the first lateral direction 205 (see FIG. 2A) prior to forming any shallow trench structures, as already discussed above with reference to the semiconductor device 100.

FIG. 2F schematically illustrates a perspective view of the semiconductor device 200 in a further advanced manufacturing stage. As illustrated, a second type of isolation trench 220, 221 may be formed so as to laterally delineate active regions of the semiconductor layer 203 along a second lateral direction 208 that is perpendicular to the first lateral direction 205. The second type of isolation trench 220, 221 may extend to the buried insulating layer 202 and, in certain areas, may have critical dimensions of 30 nm and less, as is also discussed above with reference to the semiconductor device 100.

Processes for forming the semiconductor device 200 as shown in FIG. 2F may be described in the context of FIGS. 2G-2L.

FIGS. 2G and 2H schematically illustrate cross-sectional views taken along a line p and a line c of FIG. 2F, respectively. As illustrated, an etch mask 217, for instance, comprising silicon oxynitride and the like, may be positioned above a sacrificial material 216, such as a polymer material, which may provide a planar surface topography. The mask 217 may have openings corresponding to the trenches 220, 221, wherein it should be appreciated that, in particular, the trenches 221 may also define respective device areas in which a connection to the substrate material 201 has to be established, for instance, for forming substrate diodes and the like, as is also discussed above with reference to the semiconductor device 100.

The etch mask 217 and the sacrificial material 216 may be formed on the basis of well-established process techniques involving the deposition of the material 216, for instance, by spin-on techniques, followed by the deposition of the material of the layer 217, followed by depositing any further lithography materials, such as resist and the like, which may then be exposed by immersion-based lithography techniques, as discussed above. Thereafter, the mask 217 may be patterned and may be used as an etch mask for the further processing.

FIGS. 2I and 2J schematically illustrate cross-sectional views along the lines p and c of FIG. 2F, respectively, in a further advanced manufacturing stage. As shown, the trenches 220, 221 may be formed so as to extend to the buried insulating layer 202, which may be accomplished by performing a selective etch process on the basis of the mask 217 and the sacrificial material 216 (see FIGS. 2G, 2H), wherein the buried insulating layer 202 may be used as an efficient etch stop material, as also previously discussed with reference to the semiconductor device 100.

FIGS. 2K and 2L schematically illustrate the semiconductor device 200 after the removal of the sacrificial material 216 (see FIGS. 2I, 2J), which may be accomplished by any well-established removal process for polymer materials, such as plasma-assisted processes and the like. As is evident, the second type of isolation trench 220, 221 may be provided in combination with a first type of isolation trench 210, which may extend deeply into the substrate material 201, as previously discussed, while the trenches 220, 221 may extend to the buried insulating layer 202.

Based on the device configuration as shown in FIGS. 2K and 2L, the further processing may be continued by depositing an appropriate fill material, such as silicon dioxide and the like, in order to reliably fill the deep trenches 210. After any further process sequences, such as planarization of the resulting surface topography, etching back any residual portions of the dielectric layer may also result in removal of the hard mask material 204.

FIG. 2M schematically illustrates a cross-sectional view of the semiconductor device 200 after completing the above-described process sequence and after having formed a further etch mask 226, such as a polymer material and the like, which may be provided so as to laterally define the position, shape and size of an opening 230 to be formed in the buried insulating layer 202 in order to expose a specific surface portion of the substrate material 201. To this end, well-established non-immersion lithography techniques may be applied. Thereafter, the lithography mask 226 may be used during a subsequent etch process for removing exposed portions of the material of the buried insulating layer 202, while the substrate material 201 may function as an effective etch stop material. It should be appreciated that respective etch recipes are well established in the art.

FIG. 2N schematically illustrates a cross-sectional view of the semiconductor device 200 in a further advanced manufacturing stage. As illustrated, the lithography mask 226 (see FIG. 2M) may be removed, thereby exposing portions of the semiconductor layer 203, indicated as active regions 203A, 203B, 203C. Consequently, the active semiconductor regions 203A, 203B, 203C may be laterally delineated by a first type of isolation structure based on the first type of isolation trench 210 (see FIGS. 2A, 2F), wherein, for convenience, the respective isolation structure may also be referred to by the same reference numeral as the first type of isolation trench 210. Furthermore, the active regions 203A, 203B, 203C may be further delineated by the second type of isolation trenches 220, 221, which may extend to the buried insulating layer 202. Consequently, on the basis of a two-level isolation structure or isolation trench system, a corresponding lateral delineation or bordering of the active regions 203A, 203B, 203C may be accomplished with required reduced spacing 220S of 30 nm and significantly less in some applications. Furthermore, by forming the deep isolation trenches 210 prior to forming the trenches 220 and the opening 230, less critical overlay constraints may be encountered, thereby also contributing to superior process conditions compared to conventional strategies as discussed above. Furthermore, the opening 230 may expose within the trenches 221 the respective surface portion 201A, which may be available for forming thereon respective contact regions or portions of other non-FET circuit elements.

With reference to FIGS. 3A-3L, a comparison of conventional process techniques and some illustrative embodiments of the present disclosure will now be described in order to demonstrate superior process robustness in forming a non-FET circuit element, such as a substrate diode.

Figure 3A:
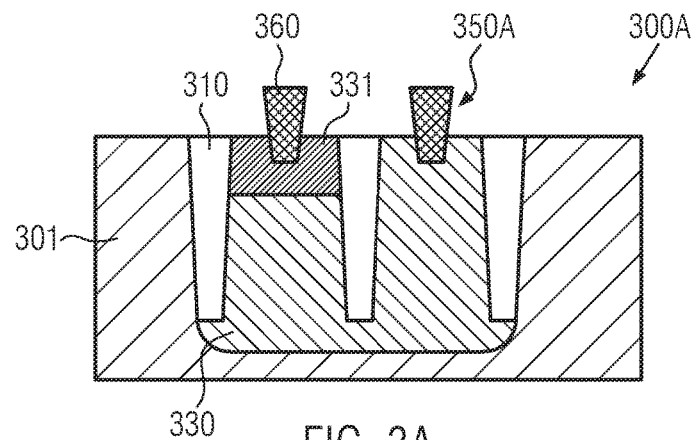
FIGS. 3A-3I schematically illustrate cross-sectional views of semiconductor devices during various manufacturing stages upon forming a substrate diode in accordance with different technology nodes, according to conventional strategies.

FIG. 3A schematically illustrates a cross-sectional view of a conventional semiconductor device 300A provided on the basis of a bulk architecture in which field effect transistors may be formed on the basis of a semiconductor material representing an upper portion of a substrate material 301. In certain areas, a substrate diode 350A may have to be provided, wherein portions thereof may be laterally delineated by deep isolation trenches 310 and a PN junction may be established by providing a highly P-doped semiconductor region 331 in contact with a highly N-doped semiconductor region 330, which may be individually contacted by respective contact elements 360. Typically, in this type of semiconductor device, respective well regions, such as N-well regions having an appropriate N-dopant concentration, may be provided, for instance, by ion implantation and the like, as required for forming respective transistor elements. Consequently, the respective well regions, for instance, represented by the N-doped region 330, may extend to a certain depth within the substrate material 301. Consequently, after forming the P-doped semiconductor region 331, a highly conductive connection from the P-doped semiconductor region 331 to the well region 330 and finally to the contact element 360 may be accomplished due to the highly conductive connection via the well region or N-doped region 330.

Figure 3B:
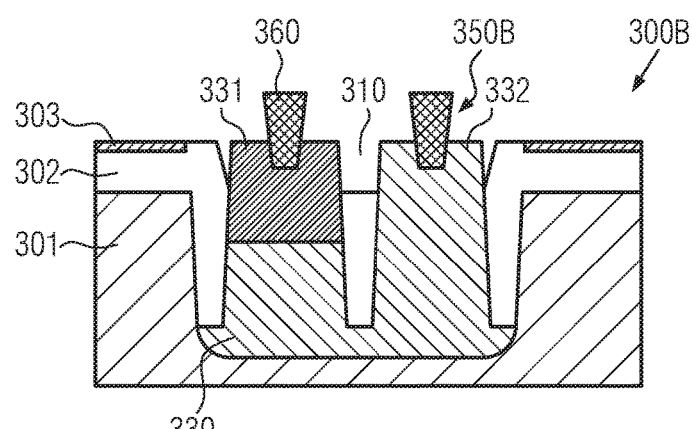

FIG. 3B schematically illustrates a cross-sectional view of a conventional semiconductor device 300B, including a very thin semiconductor layer 303 for forming fully depleted SOI transistor elements, a buried insulating layer 302 and a substrate material 301. Also in this case, in certain device areas, a substrate diode 350B may have to be provided, which may be accomplished by opening the buried insulating layer 302 and forming respective epitaxially grown semiconductor regions 331 and 332, respectively, which may be in situ doped by a P-type dopant species and an N-type dopant species, respectively. These regions may be separated by respective deep isolation structures 310. Moreover, the semiconductor regions 331, 332 may connect to highly N-doped well regions 330, thereby forming a specific PN junction with the material 331 and providing a low ohmic connection to the material 332. It should be appreciated that the low ohmic connection may be due to the fact that the respective well region 330 may have to be provided to a depth that extends below the depth of the isolation structures 310 in order to form respective connections to the well region of respective transistor elements for providing additional control mechanisms for the threshold voltage and the like. That is, in conventional fully depleted SOI devices requiring a substrate diode, the effect of well regions extending below the depth of the isolation structures 310 may be exploited in order to obtain highly functional substrate diodes as, for instance, represented by the substrate diode 350B. A corresponding configuration of the well region 330 and the isolation structure 310 may, for instance, be appropriate for semiconductor devices including critical dimensions of 22 nm.

In current approaches for even further scaling overall transistor dimensions, for instance, down to approximately 12 nm, the different configuration of respective well regions may result in different approaches and problems arising from implementing non-FET devices, such as substrate diodes.

Figure 3C:
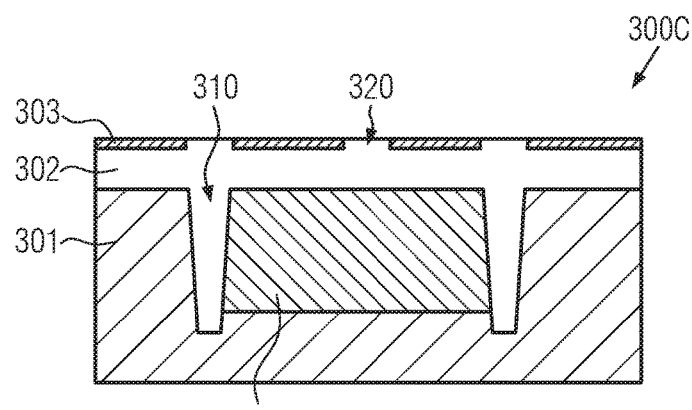

FIG. 3C schematically illustrates a cross-sectional view of a semiconductor device 300C, including a plurality of active regions 303 positioned on a buried insulating layer 302 and laterally separated by isolation structures 320 of reduced depth, wherein a certain device region is laterally delineated by the respective deep isolation structures 310. Furthermore, a well region 330, which may be formed in compliance with overall transistor requirements, may be formed in the substrate material 301 down to a depth that may be less when compared to a depth of the isolation structures 310 due to overall design constraints, as also discussed above.

Processes for forming the device configuration shown in FIG. 3C may be based on conventional process strategies.

Figure 3D:
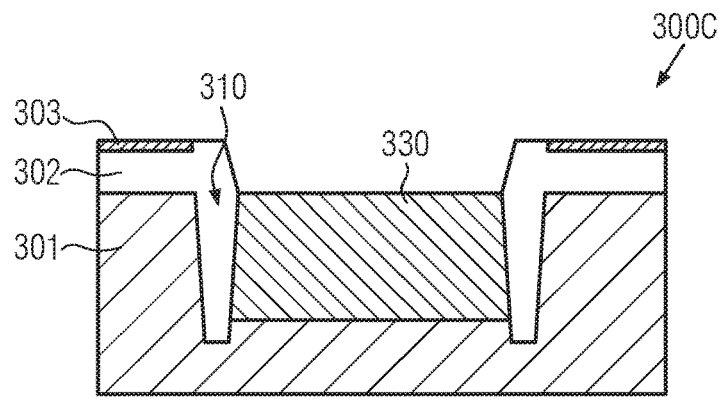

FIG. 3D schematically illustrates the semiconductor device 300C in a further advanced manufacturing stage, i.e., after removal of the active regions 303 and the material of the buried insulating layer 302 so as to expose the well region 330.

Figure 3E:
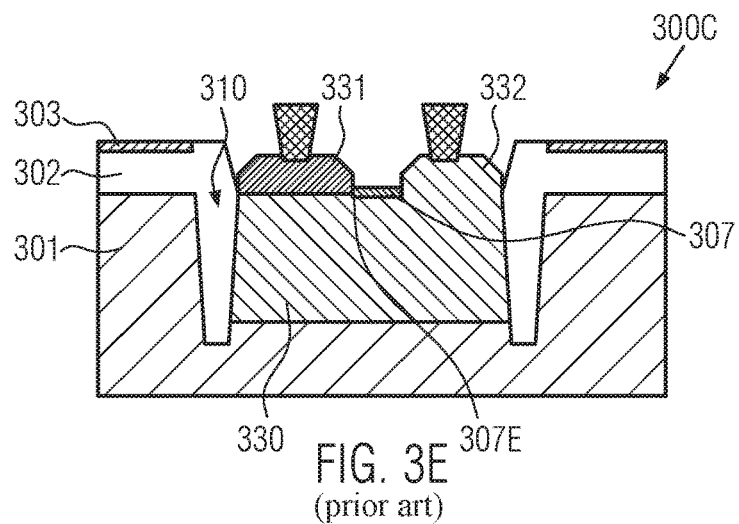

FIG. 3E schematically illustrates the semiconductor device 300C in a further advanced manufacturing stage, i.e., after forming P-doped and N-doped semiconductor regions 331, 332, respectively, which may be accomplished during selective epitaxial growth processes, which may also be applied upon forming raised drain and source regions of transistor elements. Since the well region 330 may not comprise isolated surface areas, a corresponding growth mask 307, such as silicon nitride, silicon dioxide and the like, or a remaining spacer material may be formed in order to selectively expose the respective portions during the epitaxial growth processes for forming the regions 331, 332. Accordingly, the resulting PN junction is not buried and, in particular, at an edge 307E of the growth mask 307, a plurality of stacking errors and the like, may result in a significant probability of creating device failures.

Figure 3F:
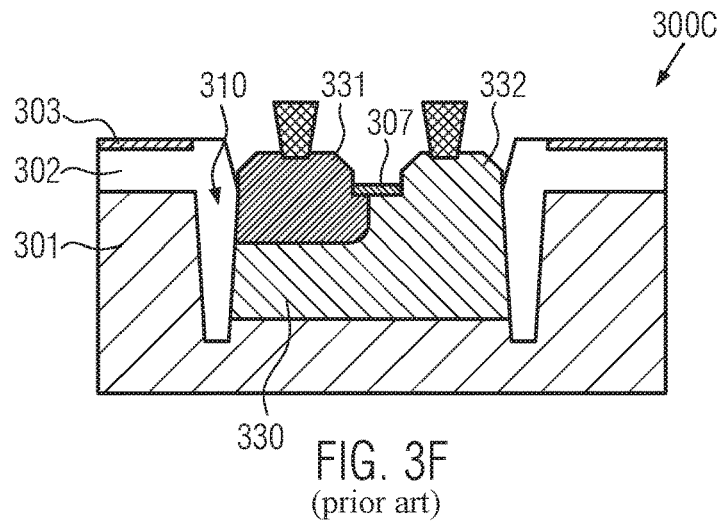

FIG. 3F illustrates a further alternative of forming the region 331, for instance, by previously recessing the well region 330, for instance, on the basis of the growth mask 307, followed by the corresponding selective epitaxial growth process and an implantation process. In this case, the edge of the region 331 in contact with the remaining portion of the region 330 may also involve a high risk of creating deposition-related issues, thereby also contributing to reduced overall device reliability.

Figure 3G:
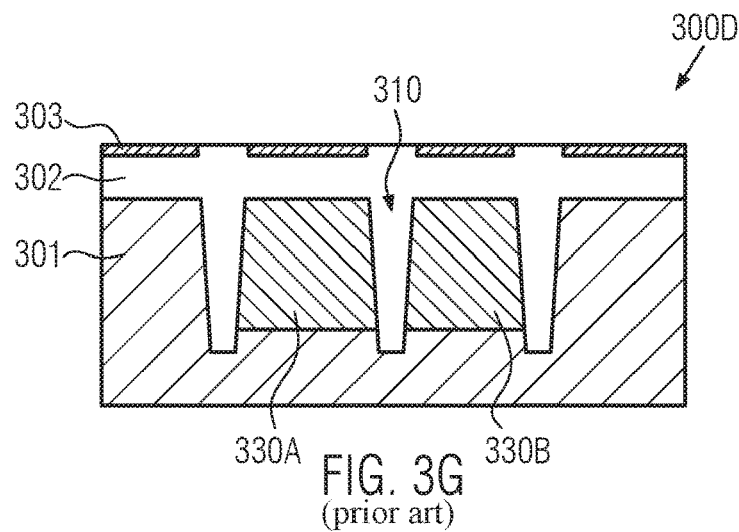

FIG. 3G schematically illustrates a conventional semiconductor device 300D similar to the device 300C, wherein an additional isolation structure 310 may be provided in the corresponding well region, thereby obtaining first and second well regions 330A, 330B laterally delineated by the isolation trench 310.

Figure 3H:
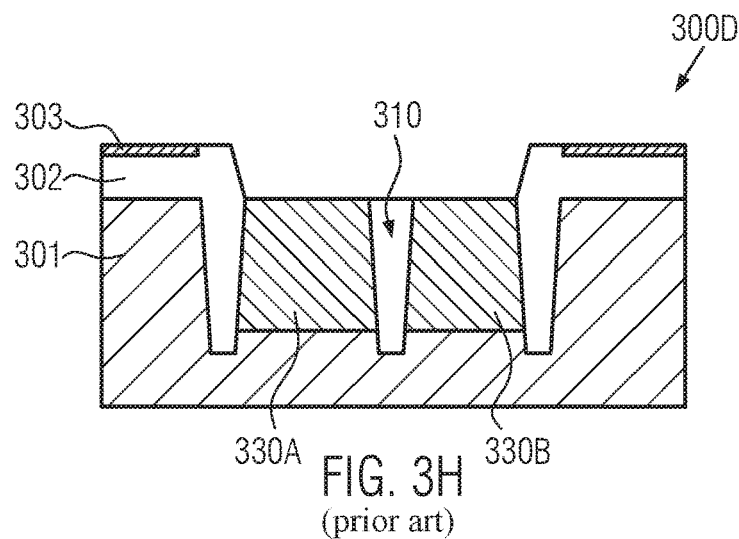

FIG. 3H schematically illustrates a cross-sectional view of the semiconductor device 300D after removal of respective active regions 303 and a portion of the buried insulating layer 302, similar to the respective configuration as described with reference to FIG. 3D and the semiconductor device 300C.

Figure 3I:
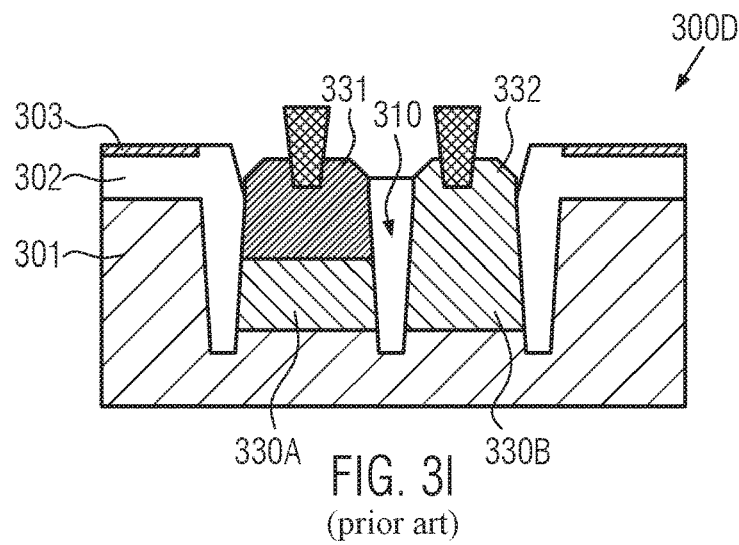

FIG. 3I schematically illustrates the semiconductor device 300D after forming the respective epitaxial grown semiconductor regions 331 and 332 on the corresponding well regions 330A, 330B, respectively. Since these well regions are laterally isolated by the respective trench isolation structure 310, superior process conditions may be achieved during the selective epitaxial growth processes, thereby obtaining the semiconductor regions 331, 332 with superior robustness, similar to the situation as described with reference to the semiconductor device 300B in FIG. 3B. Due to the reduced depth of the well regions 330A, 330B, however, the connection between these regions may be provided in the form of a very low doped semiconductor material of significantly reduced conductivity, thereby obtaining a moderately high resistance and contributing to a significantly reduced overall efficiency of the substrate diode 300D.

Figure 3J:
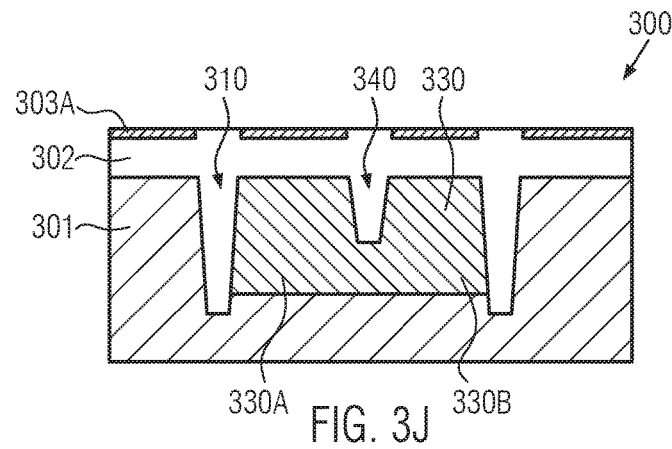
FIGS. 3J-3L schematically illustrate cross-sectional views of a semiconductor device during various manufacturing stages in forming a substrate diode on the basis of a three-level isolation trench system for providing superior process conditions, according to illustrative embodiments.

FIG. 3J schematically illustrates a semiconductor device 300 which may be formed in accordance with the process strategy previously discussed with reference to FIGS. 1A-1W. That is, the semiconductor device 300 may comprise at least two isolation structures extending into the substrate material 301, i.e., the deep isolation structure 310 extending to a depth level that may be positioned below a depth level of the well region 330, as is also discussed with reference to the semiconductor devices 300C, 300D. Additionally, the isolation structures 340 may be provided so as to extend into the material 301 with a reduced depth compared to the deep isolation structure 310, as previously discussed, thereby providing respective laterally isolated well regions 330A, 330B which are still appropriately electrically connected by the remaining portion of the well region 330.

Figure 3K:
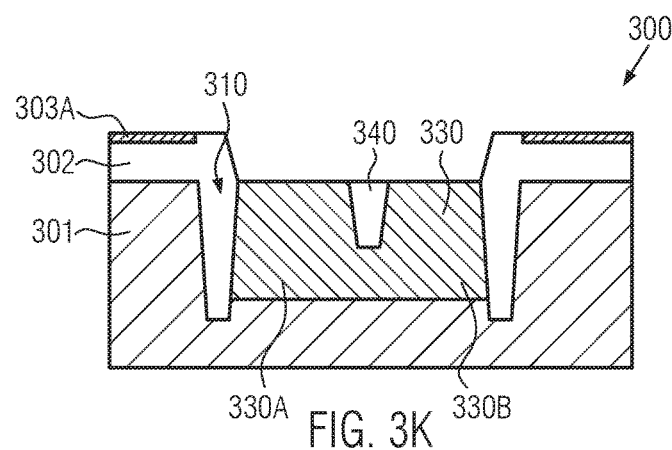

FIG. 3K schematically illustrates the semiconductor device 300 after the removal of unwanted active regions 303A and the respective portion of the buried insulating layer 302. Consequently, the isolated portions 330A, 330B of the well region 330 are exposed and are available for respective selective epitaxial growth processes on the basis of well-established and highly robust process techniques.

Figure 3L:
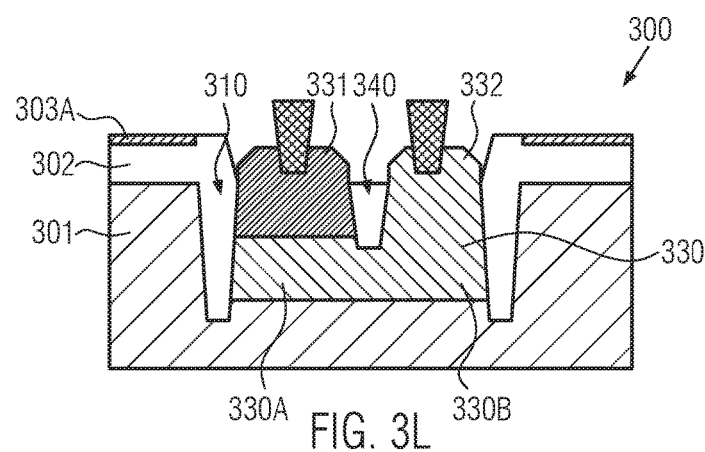

FIG. 3L schematically illustrates the semiconductor device 300 in a further advanced manufacturing stage in which respective semiconductor regions 331, 332 may be formed on the corresponding N-well regions 330A, 330B with superior process robustness, as discussed above. Consequently, a PN junction may be formed within the well region 330A, which may have a highly conductive connection to the well region 330B due to the remaining portion of the well region 330. As a consequence, by providing the isolation structure 340 of reduced depth compared to the deep isolation structures 310, for instance, in accordance with process techniques previously described with reference to FIGS. 1A-1W, superior process robustness with respect to forming non-FET devices, such as substrate diodes, may be achieved.

With reference to FIGS. 4A-4I, further illustrative embodiments will now be described in which the patterning of deep isolation trenches may be accomplished on the basis of a deposition process in combination with a lithography sequence. It should be appreciated that the embodiments described with reference to FIGS. 4A-4I may be readily combined with any of the embodiments previously discussed in the context of FIGS. 1A-1W and 2A-2N.

Figure 4A:
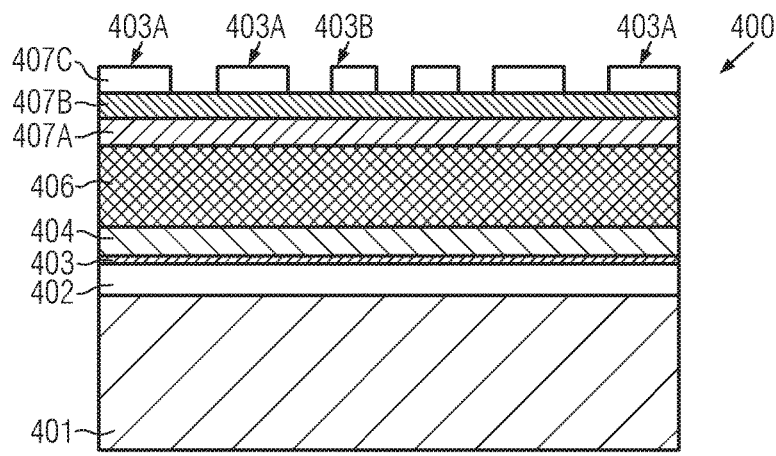
FIGS. 4A-4I schematically illustrate cross-sectional views of a semiconductor device during various manufacturing stages in forming deep trenches, i.e., a first type of isolation trench, on the basis of an additional liner material for defining the final dimensions of the isolation trenches, according to still further illustrative embodiments.

FIG. 4A schematically illustrates a cross-sectional view of a semiconductor device 400 which may represent any of the semiconductor devices 100 and 200. In this manufacturing stage, the semiconductor device 400 may comprise a substrate material 401, followed by a buried insulating layer 402, a semiconductor layer 403 and a hard mask layer 404. Regarding configuration and material composition of any of these components, reference may also be made to the corresponding components 101-104 and 201-204 of the semiconductor devices 100 and 200, respectively. Moreover, in this manufacturing stage, a sacrificial layer 406, such as a polymer material, may be provided, in combination with a stack of layers 407A, 407B and 407C. In this layer stack, the layers 407A and 407B may represent a bottom anti-reflective layer and an appropriate mask material, such as silicon oxynitride, respectively. Furthermore, the layer 407C may represent a patterned resist material that may be used for patterning the layers 407B, 407A.

It should be appreciated that, in FIG. 4A, a densely packed device region, such as a static RAM area, may be illustrated, in which a respective memory cell, for instance, based on 6 transistor elements, may have to be provided and the respective active regions may be patterned in accordance with process techniques as previously discussed in the context of the semiconductor devices 100 and 200. Thus, the semiconductor device 400 may include the resist layer 407C so as to laterally define respective active regions 403A, 403B, which may have different lateral size so as to comply with the respective current-carrying capacities of respective transistor elements of a RAM cell. For example, the active regions 403A may correspond to active regions for pass-gate transistor elements and pull-down transistor elements, basically requiring an increased current-carrying capacity. On the other hand, the active regions 403B may be provided for pull-up transistors requiring a reduced current-carrying capacity. It should be further appreciated that, although the mask layer 407C may basically determine the overall lateral dimensions of the active regions 403A, 403B, the fine tuning of the lateral dimensions may be obtained on the basis of a liner material, as will be discussed in more detail later on.

Generally, the semiconductor device 400 as illustrated in FIG. 4A may be formed in accordance with well-established process techniques, in particular, including immersion-based lithography processes in order to obtain the patterned layer 407C.

Figure 4B:
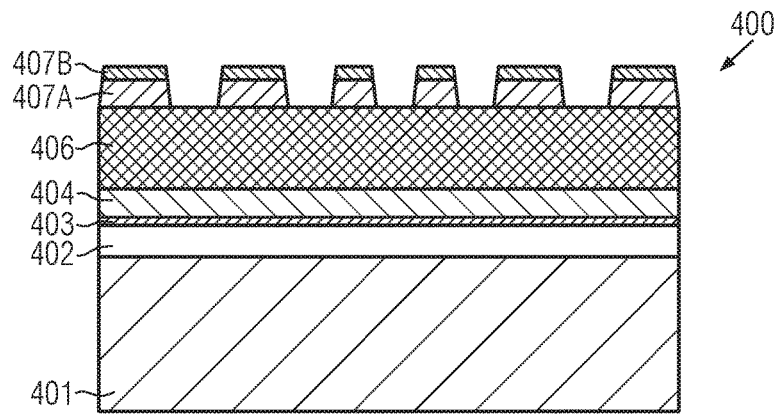

FIG. 4B schematically illustrates the semiconductor device 400 in a further advanced manufacturing stage in which an etch process may have been performed so as to pattern the layers 407B and 407A on the basis of the patterned resist material 407C (see FIG. 4A). To this end, any well-established etch recipes may be applied, for instance, for etching through the bottom anti-reflective coating and the silicon oxynitride material.

Figure 4C:
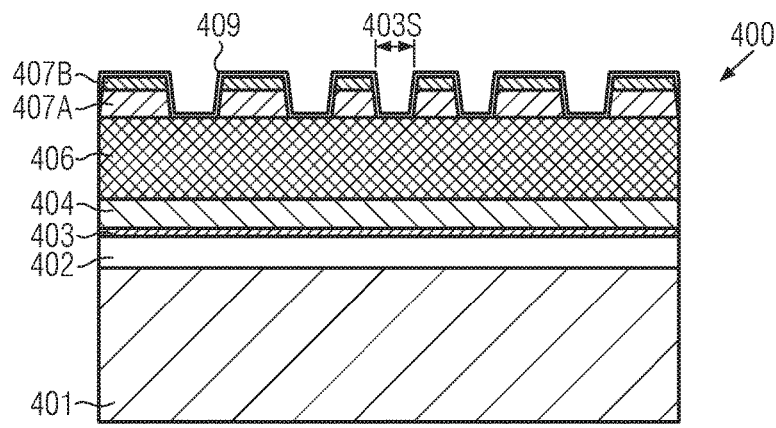

FIG. 4C schematically illustrates the semiconductor device 400 after the deposition of a liner material 409, which may include any appropriate material for which respective deposition cycles and precursor materials are available and which may have a certain etch resistivity with respect to a subsequent patterning of the underlying material. For example, a plurality of atomic layer deposition (ALD) techniques is available for a plurality of metal-containing materials, which may also exhibit pronounced etch selectivity with respect to a plurality of etch recipes. In particular, the deposition of the liner material 409 may be performed on the basis of a process temperature in the range of 100° C. and significantly less, for instance, at approximately room temperature, thereby preserving integrity of any non-hard mask materials, such as the materials 407B and 406. Since, in ALD techniques, in particular, the finally obtained thickness may be precisely determined by selecting an appropriate number of deposition cycles, wherein each pair of cycle provides a very precise layer thickness, the lateral spacing 403S between adjacent active semiconductor regions still to be formed may, therefore, be essentially determined by the liner material 409, thereby enabling even further reduced spacings 403S compared to those obtainable by merely applying immersion-based lithography techniques.

Figure 4D:
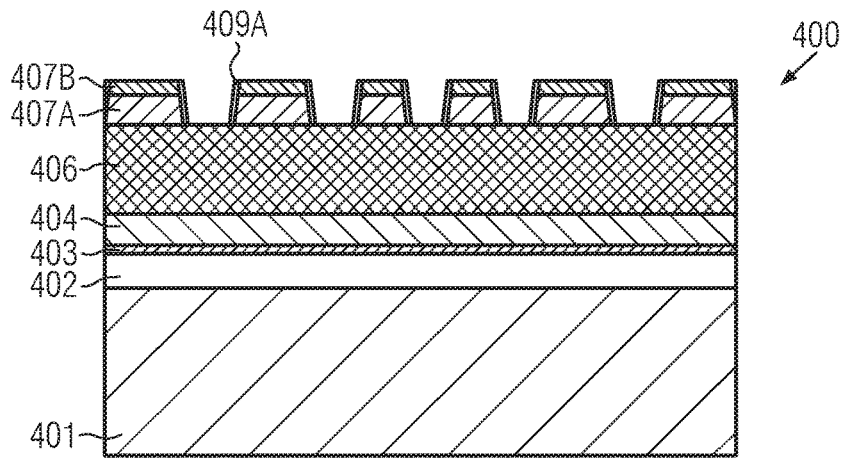

FIG. 4D schematically illustrates the semiconductor device 400 after performing an anisotropic etch process, thereby maintaining sidewall spacers 409A of the previously deposited liner material 409 (see FIG. 4C), while substantially removing this material from horizontal surface portions. To this end, an etch recipe with high directionality, for instance, a plasma-based etch recipe with increased physical component and reduced chemical component, may be applied.

Figure 4E:
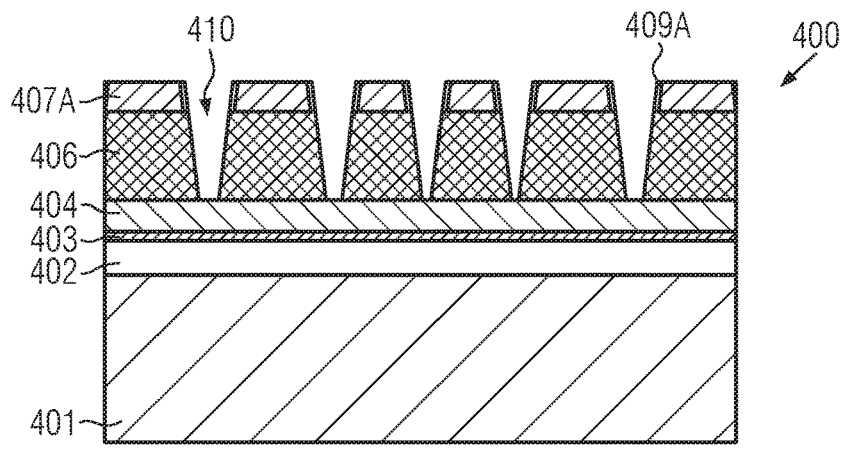

FIG. 4E schematically illustrates the semiconductor device 400 in a further advanced manufacturing stage, in which openings for deep isolation trenches 410 may be formed in the sacrificial material 406, which may be accomplished on the basis of well-established etch techniques, in which the previously patterned materials 407A, 407B (see FIG. 4D), in combination with the sidewall spacers 409A, may be used as etch masks.

Figure 4F:
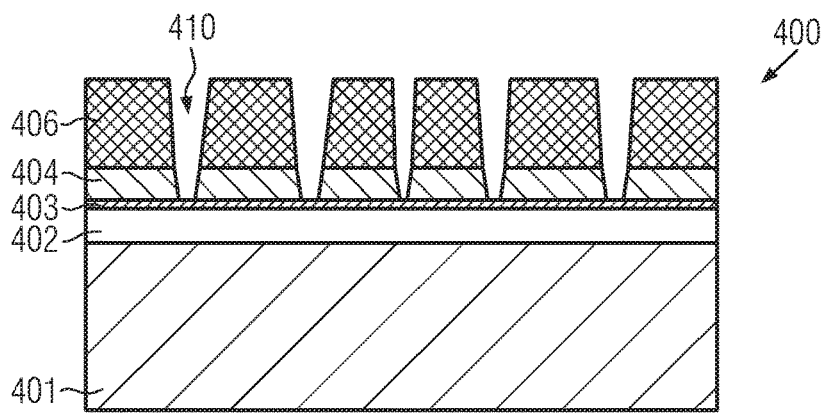

FIG. 4F schematically illustrates the semiconductor device 400 after performing a further etch process in order to extend the openings for the trenches 410 into the hard mask material 404. For this etch step, well-established process recipes are also available.

Figure 4G:
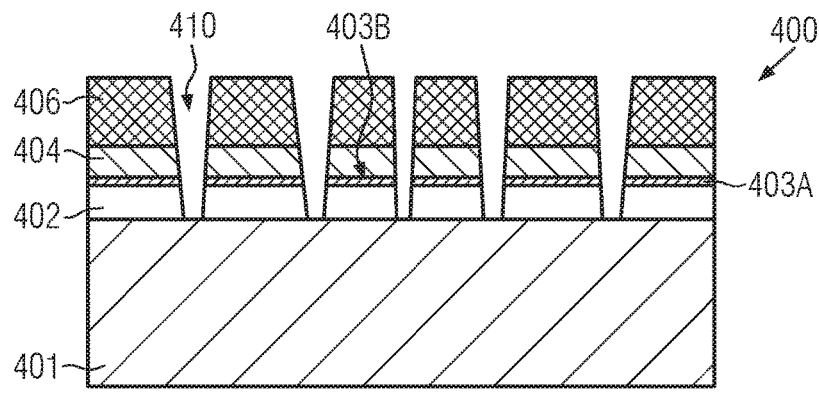

FIG. 4G schematically illustrates the semiconductor device 400 in a further advanced manufacturing stage. As illustrated, a further etch sequence may be applied so as to extend the openings for the respective isolation trenches 410 through the semiconductor layer 403 and the buried insulating layer 402. Consequently, at this manufacturing stage, the corresponding active regions 403A, 403B having the different lateral dimensions, may be delineated at least along one lateral direction, such as a lateral direction that is perpendicular to the drawing plane of FIG. 4G. It should be appreciated that well-established etch techniques may also be applied to etch through the semiconductor layer 403 and the buried insulating layer 402.

Figure 4H:
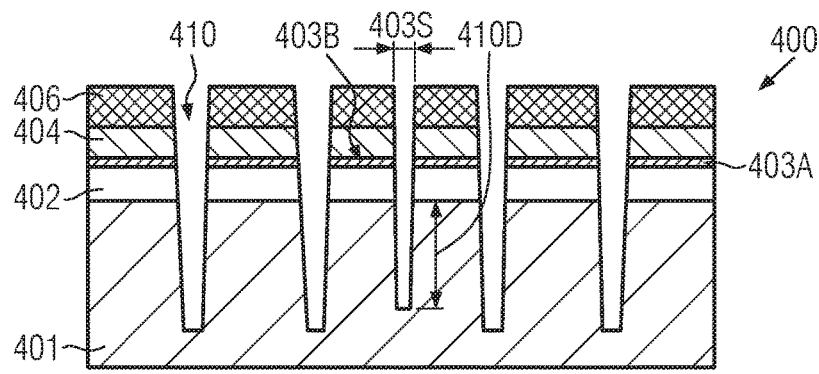

FIG. 4H schematically illustrates the semiconductor device 400 in a further advanced manufacturing stage. As illustrated, the deep trenches 410 have been completed on the basis of a further etch process for etching into the substrate material 401 to a desired minimum depth. As indicated, the finally obtained depth of the isolation trenches 410 may also depend on the corresponding spacing 403S of respective adjacent active regions. That is, for a reduced "width" of a respective isolation trench 410, the resulting etch rate may be reduced compared to trenches of increased widths, thereby arriving at a specific controlled etch time at a reduced depth, which may represent a minimum depth, as indicated by 410D. It should be appreciated that the minimum depth 410D may still be significantly deeper compared to a depth of any further isolation trenches, which may still be formed during the further processing, such as, for instance, discussed with reference to the semiconductor device 100 when forming the respective isolation trenches 130 (see FIG. 1W). It should be further appreciated that, typically, the lateral spacing 403S of the deep trenches 410 may still be significantly greater compared to a lateral spacing obtained by very shallow isolation trenches, such as the lateral spacings 120S (see FIG. 1W) and 220S (see FIG. 2N).

Figure 4I:
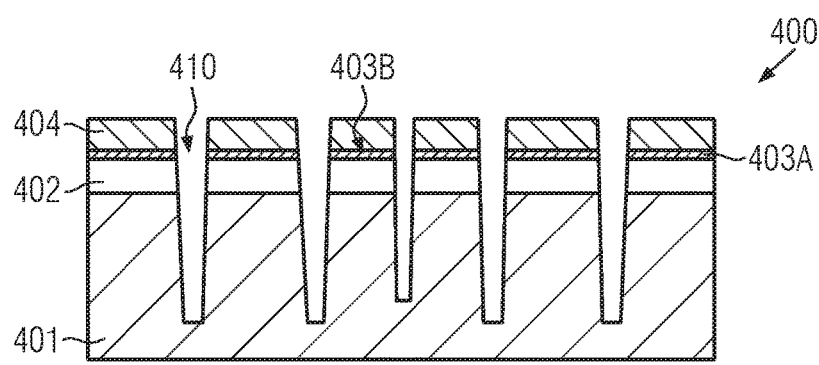

FIG. 4I schematically illustrates the semiconductor device 400 after the removal of the sacrificial material 406 (see FIG. 4H), which may be accomplished on the basis of well-established plasma-assisted etch recipes, possibly in combination with respective cleaning processes. Consequently, in this manufacturing stage, the hard mask material 404 may be still in place and may cover the respective active semiconductor regions 403A, 403B having different lateral dimensions, at least along the horizontal direction of FIG. 1I, in order to comply with the corresponding current-carrying capacities of the respective transistor elements still to be formed on the basis of the active regions 403A, 403B. As a consequence, the manufacturing stage as shown in FIG. 4I may correspond to the manufacturing stages as shown in FIGS. 1A and 2A and the further processing may be continued as described above in the context of these figures. That is, thereafter, further isolation trenches for laterally delineating the active regions 403A, 403B in a second orthogonal direction may be formed in accordance with overall device requirements. Thereafter, respective openings and/or further isolation trenches may be formed, as also discussed above.

It should be appreciated that, in particular, the formation of shallow isolation trenches for laterally delineating the active regions 403A, 403B on the basis of techniques as described in the context of the semiconductor devices 100 and 200, may also be "fine-tuned" by using the corresponding liner, such as the liner 409 (see FIG. 4C) in order to further reduce the spacing of adjacent active regions beyond the resolution that would be obtained by pure immersion-based lithography.

As a result, the present disclosure provides manufacturing techniques and corresponding semiconductor devices in which active regions may be laterally delineated or bordered by a three-level structure system and a two-level isolation structure system, respectively, either of which may, nevertheless, provide superior overlay robustness by initially forming the deep isolation trenches. In illustrative embodiments of the three-level isolation structure system, superior process robustness may be accomplished by providing isolated substrate material regions in which in situ doped semiconductor material may be epitaxially grown on the basis of well-established process strategies. Moreover, the process strategy disclosed herein may provide further scalability in that connection to well regions may be reliably provided within corresponding openings, which, in some illustrative embodiments, may provide even further laterally isolated semiconductor regions, as discussed above. Consequently, the present disclosure may provide the potential for device scaling for a technology node in which semiconductor devices have to produced that include transistor elements based on fully depleted SOI configurations with critical dimensions of 26 nm and less.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a short-hand reference to such steps/structures and does not necessarily imply that such steps/structures are performed/formed in that ordered sequence. Of course, depending upon the exact claim language, an ordered sequence of such processes may or may not be required.

Accordingly, the protection sought herein is as set forth in the claims below.

What is claimed:

1. A method, comprising:
    forming a first type of isolation trench so as to delineate active regions for transistor elements in a semiconductor layer along a first lateral direction, said first type of isolation trench extending through said semiconductor layer, a buried insulating layer and into a substrate material;
    after forming said first type of isolation trench, forming a second type of isolation trench so as to delineate said active regions along a second lateral direction that differs from said first lateral direction, said second type of isolation trench extending to said buried insulating layer; and
    after forming said second type of isolation trench, forming an opening so as to expose a portion of said substrate material at a position that is laterally offset from said active region delineated by said first and second types of isolation trench.

2. The method of claim 1, wherein forming an opening so as to expose a portion of said substrate material comprises forming said opening so as to provide an exposed surface of said substrate material for further processing.

3. The method of claim 1, wherein forming an opening so as to expose a portion of said substrate material comprises forming said opening by removing a portion of said substrate material and forming a third type of isolation trench extending into said substrate material less than said first type of isolation trench.

4. The method of claim 1, further comprising filling said first and second types of isolation trench with a dielectric material.

5. The method of claim 4, wherein said first and second types of isolation trench are filled prior to forming said opening.

6. The method of claim 3, wherein said first, second and third types of isolation trench are filled prior to forming said opening.

7. The method of claim 1, wherein said first and second types of isolation trench are formed on the basis of immersion lithography and said opening is formed on the basis of non-immersion lithography.

8. The method of claim 1, further comprising forming an epitaxially grown semiconductor material on said substrate material.

9. The method of claim 8, wherein said epitaxially grown semiconductor material is a contact region for electrically connecting to a well region formed below said buried insulating layer at a region that corresponds to said active region.

10. The method of claim 8, further comprising forming a circuit element in said opening by using said epitaxially grown semiconductor material.

11. The method of claim 1, wherein forming said first type of isolation trench comprises forming a mask layer stack above said semiconductor layer, patterning an upper portion of said mask layer stack on the basis of a resist mask and patterning a lower portion of said mask layer stack by using said patterned upper portion of said mask layer stack.

12. The method of claim 11, further comprising adjusting a trench dimension by forming a liner on said patterned upper portion of said mask layer stack prior to patterning said lower portion of said mask layer stack.

13. The method of claim 12, wherein said liner is formed in one or more deposition processes at a temperature of approximately 100° C. and less.

14. The method of claim 1, wherein said second type of isolation trench is formed with a width of approximately 30 nm and less.

* * * * *